(12) United States Patent
Shirlen et al.

(10) Patent No.: US 9,208,008 B2
(45) Date of Patent: Dec. 8, 2015

(54) METHOD AND APPARATUS FOR MULTI-CHIP REDUCED PIN CROSS TRIGGERING TO ENHANCE DEBUG EXPERIENCE

(71) Applicant: QUALCOMM Incorporated, San Diego, CA (US)

(72) Inventors: Ryan Shirlen, Wake Forest, NC (US); Victor Wong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 266 days.

(21) Appl. No.: 13/963,292

(22) Filed: Aug. 9, 2013

(65) Prior Publication Data

US 2015/0033082 A1    Jan. 29, 2015

Related U.S. Application Data

(60) Provisional application No. 61/857,881, filed on Jul. 24, 2013.

(51) Int. Cl.

| | |
|---|---|
| *G06F 11/22* | (2006.01) |
| *G06F 11/07* | (2006.01) |
| *G06F 13/40* | (2006.01) |
| *G01R 31/317* | (2006.01) |
| *G06F 11/36* | (2006.01) |
| *G06F 11/263* | (2006.01) |
| *H04L 5/22* | (2006.01) |
| *G06F 15/78* | (2006.01) |

(52) U.S. Cl.
CPC ...... *G06F 11/0724* (2013.01); *G01R 31/31705* (2013.01); *G06F 11/2242* (2013.01);
(Continued)

(58) Field of Classification Search
CPC .............. G06F 11/0724; G06F 11/263; G06F 11/2242; G06F 11/3656; G06F 13/4027; G06F 15/7807; G06F 15/7825; H04Q 11/04; H04Q 11/0421; H04L 5/22
See application file for complete search history.

(56) References Cited

U.S. PATENT DOCUMENTS 5,265,207 A * 11/1993 Zak et al. .................... 712/15
5,333,268 A * 7/1994 Douglas et al. ............ 709/244
(Continued)

FOREIGN PATENT DOCUMENTS

| EP | 1415230 | 5/2004 |
|---|---|---|
| EP | 2562650 A1 | 2/2013 |

(Continued)

OTHER PUBLICATIONS

International Search Report and Written Opinion—PCT/US2014/043938—ISA/EPO—Oct. 22, 2014.

*Primary Examiner* — Joseph Schell
(74) *Attorney, Agent, or Firm* — The Marbury Law Group, PLLC

(57) ABSTRACT

Embodiments include apparatuses, systems, and methods for reduced pin cross triggering to enhance a debug experience. A time-division packetizing (TDP) technique may be employed to facilitate communication of triggers between integrated circuits (ICs) connected in series forming a TDP communication ring. The ICs on the TDP communication ring may each include a cross trigger interconnect structure for interpreting between trigger signals and hardware core instructions. The serial TDP communication across the ICs on the TDP communication ring allows the ICs to be connected in a manner that each cross trigger interconnect structure on each IC may function as if it were part of a single cross trigger interconnect structure across all of the ICs on the TDP communication ring. The individual ICs may operate asynchronously and a trigger clock may be passed along with other trigger data to implement the debugging techniques uniformly on each IC.

36 Claims, 7 Drawing Sheets

(52) U.S. Cl.
CPC .......... *G06F11/263* (2013.01); *G06F 11/3656* (2013.01); *G06F 13/4027* (2013.01); *G06F 15/7807* (2013.01); *H04L 5/22* (2013.01)

(56) References Cited

U.S. PATENT DOCUMENTS

| | | | |
|---|---|---|---|
| 5,353,412 A | * | 10/1994 | Douglas et al. ............... 709/243 |
| 7,468,988 B2 | * | 12/2008 | Pail ...................... H04Q 3/0025 370/442 |
| 8,407,528 B2 | | 3/2013 | Larson |
| 2012/0144240 A1 | | 6/2012 | Rentschler et al. |
| 2012/0150474 A1 | | 6/2012 | Rentschler et al. |

FOREIGN PATENT DOCUMENTS

| | | |
|---|---|---|
| WO | 03012640 A1 | 2/2003 |
| WO | 03017099 A1 | 2/2003 |
| WO | 03017148 A1 | 2/2003 |

* cited by examiner

METHOD AND APPARATUS FOR MULTI-CHIP REDUCED PIN CROSS TRIGGERING TO ENHANCE DEBUG EXPERIENCE

RELATED APPLICATIONS

This application claims the benefit of priority to U.S. Provisional Patent Application No. 61/857,881, entitled "Method and Apparatus for Multi-chip Reduced Pin Cross Triggering To Enhance Debug Experience", and filed Jul. 24, 2013, the entire contents of which are hereby incorporated by reference for all purposes.

BACKGROUND

System-On-Chip (SoC) and integrated circuit (IC) designs are increasingly complex, and more and more processors are integrated into SoCs/ICs to perform increasingly varying and complex functionalities. Also, multiple SoCs/ICs are commonly linked together for advanced applications. Multiple processors/SoCs/ICs can be involved in performing certain tasks, and each processor/SoC/IC can be dependent on one or more others to complete the tasks.

To ensure continuous and smooth performance of the processors/SoCs/ICs by avoiding lockups and crashes, these components are thoroughly debugged before they are made available for use and sale. Debugging logic is traditionally designed to facilitate single or multiprocessor debug functions on a single SoC. Functions such as halting and resuming of execution of a single processor core, synchronized halting and resuming of multiple processor cores, processor trace enablement and disablement, trace capture enablement are all examples of intra-SoC debug functions. It should be noted that on current complex SoCs that debug functions extend far beyond processor debugging. Other functions such as distributed performance monitoring, hardware (non-processor) trace functions, driver level trace units such as ARM's system trace macrocell, deterministic traffic injection (busses, state machines, peripheral interfaces) are other (non-processor) examples of intra-SoC debug functions.

Currently cross triggering hardware is used to provide low latency signaling from one SoC debug function to another SOC debug function. Cross trigger blocks such as ARM's cross trigger interface (CTI) are preconfigured by a debug agent (software agent or external debugger) to route a given set of trigger sources to a given set of trigger destinations. Functions such as stopping trace collection in a circular buffer upon detection of fatal system event (e.g. watchdog expiry), enabling of distributed performance monitors, synchronized halting of multiple processors may all be facilitated via preconfiguration of one or more SoC cross trigger blocks (e.g. ARM CTI). To facilitate cross trigger amongst two or more SoCs (e.g. synchronized processor resume of two processors residing on different SoCs), the current technique is to route a discrete number of cross trigger wires via shared or dedicated pins on each SoC. When multiple cross trigger use cases are required to run concurrently, the number of pins between SOCs becomes prohibitively expensive so another technique is needed.

SUMMARY

The methods and apparatuses of various aspects provide circuits and methods for communicating trigger values for use in debugging a plurality of interconnected hardware cores including initiating, by a first interconnected hardware core, a time-division packetizing (TDP) signal having a sequence start signature and a number of slots, in which each slot includes a count value configured to indicate whether the slot is free or contains a trigger value, sending, by the first interconnected hardware core, the TDP signal to a second interconnected hardware core, receiving, by the first interconnected hardware core, the TDP signal by a third interconnected hardware core, determining, by the first interconnected hardware core, whether each slot contains a first trigger value based on a first count value of the slot, for each slot containing the first trigger value, passing the first trigger value to a cross trigger interconnect structure of the first interconnected hardware core and modifying that slot's first count value, retransmitting the TDP signal including the sequence start signature and the number of slots in which each slot includes one of the first trigger value when that slot's modified first count value indicates that slot contains the first trigger value, a second trigger value obtained from the cross trigger interconnect structure along with a second count value indicating the slot contains the second trigger value when the first interconnected hardware core has the second trigger value to transmit and that slot's modified first count value indicates the slot is free, and an empty slot with the second count value indicating that slot is free when the first interconnected hardware core does not have the second trigger value to transmit and that slot's modified first count value indicates that the slot is free.

An aspect method may further include sending, by the first interconnected hardware core, a first clock signal to the second interconnected hardware core, and receiving, by the first interconnected hardware core, a second clock signal from the third interconnected hardware core. In one aspect, the received second clock signal is the first clock signal, and in another aspect, the received second clock signal is different from the first clock signal. An aspect method may further include associating, by the cross trigger interconnect structure of the first interconnected hardware core, a first trigger function to the first trigger value, and implementing, by the first interconnected hardware core, the first trigger function according to the first clock signal.

An aspect method may further include associating, by the cross trigger interconnect structure of the first interconnected hardware core, the second trigger value to a second trigger function, and writing, by the first interconnected hardware core, the second trigger value and the second count value to the slot. An aspect method may further include setting the first and second count values to one less than the plurality of interconnected hardware cores, in which the first count value is configured to represent a number of the interconnected hardware cores yet to read the first trigger value, the second count value is configured to represent a number of the interconnected hardware cores yet to read the second trigger value, and the first and second count values are configured to indicate the slot is free when the first and second count values are equal to zero, and in which modifying the first count value further comprises decrementing the first count value. In an aspect method, the plurality of interconnected hardware cores may be configured to connect in a ring configuration such that each interconnected hardware core is configured to connect to two other interconnected hardware cores, in which the first interconnected hardware core is configured to transmit to the second interconnected hardware core and receive from the third interconnected hardware core, the second interconnected hardware core is configured to transmit to the third interconnected hardware core and receive from the first interconnected hardware core, and the third interconnected hardware core is configured to transmit to the first interconnected hardware core and receive from the second interconnected hardware core. In an aspect method, the plurality of interconnected hardware cores are configured to operate via asynchronous clock cycles.

An aspect includes a first integrated circuit, including a plurality of trigger sources and trigger sinks, a cross trigger interconnect structure configured to interconnect the plurality of trigger sources and trigger sinks, a time-division packetizing transmitter (TDPTx) circuit coupled to the cross trigger interconnect structure and to a data output pin and configured to connect to a second integrated circuit, and a time-division packetizing receiver (TDPRx) circuit coupled to the cross trigger interconnect structure and to a data input pin and configured to connect to a third integrated circuit, in which the TDPRx circuit is configured to perform operations including receiving a time-division packetizing (TDP) signal from the third integrated circuit, the TDP signal having a sequence start signature and a number of slots, in which each slot includes a count value configured to indicate whether the slot is free or contains a trigger value, determining whether each slot in the TDP signal contains a first trigger value based on a first count value of the slot, and passing the first trigger value in each slot containing the first trigger value to the cross trigger interconnect structure and modifying that slot's first count value, in which the TDPTx circuit is configured to perform operations including retransmitting to the second integrated circuit the TDP signal including the sequence start signature and the number of slots in which each slot includes one of the first trigger value when that slot's modified first count value indicates that slot contains the first trigger value, a second trigger value obtained from the cross trigger interconnect structure along with a second count value indicating the slot contains the second trigger value when the first integrated circuit has the second trigger value to transmit and that slot's modified first count value indicates the slot is free, and an empty slot with the second count value indicating that slot is free when the first integrated circuit does not have the second trigger value to transmit and that slot's modified first count value indicates that the slot is free.

An aspect includes a non-transitory processor-readable medium having stored thereon processor-executable software instructions configured to be executed by an interconnected hardware core to perform operations including initiating, by a first interconnected hardware core, a time-division packetizing (TDP) signal having a sequence start signature and a number of slots, in which each slot includes a count value configured to indicate whether the slot is free or contains a trigger value, sending, by the first interconnected hardware core, the TDP signal to a second interconnected hardware core, receiving, by the first interconnected hardware core, the TDP signal by a third interconnected hardware core, determining, by the first interconnected hardware core, whether each slot contains a first trigger value based on a first count value of the slot, for each slot containing the first trigger value, passing the first trigger value to a cross trigger interconnect structure of the first interconnected hardware core and modifying that slot's first count value, retransmitting the TDP signal including the sequence start signature and the number of slots in which each slot includes one of, the first trigger value when that slot's modified first count value indicates that slot contains the first trigger value, a second trigger value obtained from the cross trigger interconnect structure along with a second count value indicating the slot contains the second trigger value when the first interconnected hardware core has the second trigger value to transmit and that slot's modified first count value indicates the slot is free, and an empty slot with the second count value indicating that slot is free when the first interconnected hardware core does not have the second trigger value to transmit and that slot's modified first count value indicates that the slot is free.

An aspect includes a circuit for use in debugging a plurality of interconnected hardware cores that includes means for initiating within a first interconnected hardware core a time-division packetizing (TDP) signal having a sequence start signature and a number of slots, in which each slot includes a count value configured to indicate whether the slot is free or contains a trigger value, means for sending the TDP signal to a second interconnected hardware core, means for receiving the TDP signal by a third interconnected hardware core, means for determining whether each slot contains a first trigger value based on a first count value of the slot, means for passing the first trigger value to a cross trigger interconnect structure of the first interconnected hardware core and means for modifying that slot's first count value for each slot containing the first trigger value, means for retransmitting the TDP signal including the sequence start signature and the number of slots in which each slot includes one of the first trigger value when that slot's modified first count value indicates that slot contains the first trigger value, a second trigger value obtained from the cross trigger interconnect structure along with a second count value indicating the slot contains the second trigger value when the first interconnected hardware core has the second trigger value to transmit and that slot's modified first count value indicates the slot is free, and an empty slot with the second count value indicating that slot is free when the first interconnected hardware core does not have the second trigger value to transmit and that slot's modified first count value indicates that the slot is free.

BRIEF DESCRIPTION OF THE DRAWINGS

The accompanying drawings, which are incorporated herein and constitute part of this specification, illustrate exemplary embodiments of the invention, and together with the general description given above and the detailed description given below, serve to explain the features of the invention.

DETAILED DESCRIPTION

Figure 1:
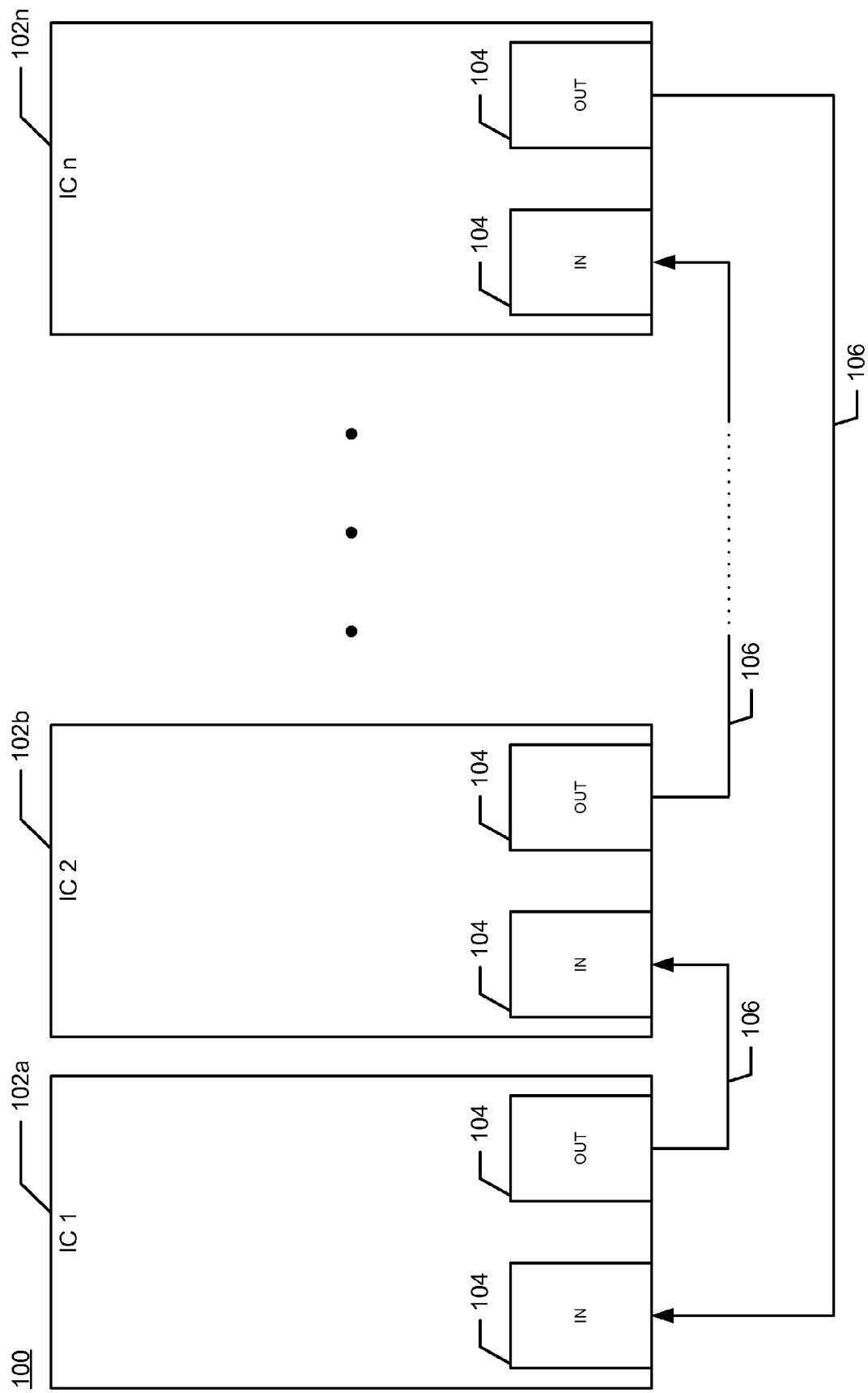
FIG. 1 is a component block diagram illustrating a system having a plurality of integrated circuits communicatively connected in series in accordance with an embodiment.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The word "exemplary" is used herein to mean "serving as an example, instance, or illustration." Any implementation described herein as "exemplary" is not necessarily to be construed as preferred or advantageous over other implementations.

The terms "system-on-chip" (SoC) and "integrated circuit" (IC) are used interchangeably herein to refer to a set of interconnected electronic circuits typically, but not exclusively, including a hardware core, a memory, and a communication interface. A hardware core may include a variety of different types of processors, such as a general purpose processor, a central processing unit (CPU), a digital signal processor (DSP), a graphics processing unit (GPU), an accelerated processing unit (APU), an auxiliary processor, a single-core processor, and a multicore processor. A hardware core may further embody other hardware and hardware combinations, such as a field programmable gate array (FPGA), an application-specific integrated circuit (ASIC), other programmable logic device, discrete gate logic, transistor logic, performance monitoring hardware, watchdog hardware, and time references. ICs maybe configured such that the components of the IC reside on a single piece of semiconductor material, such as silicon. Such a configuration may also be referred to as the IC components being on a single chip. The term "linked IC" refers to two or more interconnected IC's that are to be debugged as an integrated system. For example, two or more hardware cores that are interconnected and configured to operate as a system of interconnected hardware cores may be referred to as "linked ICs" herein for ease of description.

The various aspects provide the ability to increase the number of triggers, linked chips, use cases, and software programming that may be addressed for debugging linked ICs, with minimal complexity and low cost. The various aspects utilize an inter-IC communication method and circuits to communicate triggers, trigger values, flags, state values, etc. (referred to generally herein as "triggers" or "trigger values") generated on one IC to all other linked IC's. The inter-IC communication method employs time-division packet data structures in which time slots in a serial data packet are used to communicate trigger values to all ICs in a system where time slots can be reused after trigger values are relayed one time around the communication loop. This inter-IC communication method is referred to as time-division packetizing (TDP). The linked IC's include circuits for supporting the generation, relay and reception of TDP signals which pass triggers in communication time slots from one IC to the next, until each trigger has been received by all of the other ICs (i.e., all linked ICs except the IC initiating communication of the trigger). The result of implementing the various aspects on a set of linked ICs being debugged may be an effective cross trigger interconnect structure (CTIS) spanning all of the ICs as if all ICs were all in the same chip.

The aspect methods of communicating a trigger value from one IC to the next as trigger values or flags encoded in a particular time slot within a message packet that is relayed around the communication ring is referred to herein as "TDP signaling" and the communication ring linking the IC's is referred to as a "TDP communication ring." This terminology is for ease of description. The aspect methods which incorporate time divisions of message packets for relaying particular trigger values or flags should not be confused with conventional time-division multiplexed communication protocols, such as used in cellular telephone network protocols (i.e., TDMA protocols) that implement a very different form of time-division based communication.

The aspects implement a TDP communication ring to communicate various triggers between linked ICs to efficiently expand the number of triggers that can be defined, ICs that can be linked, and concurrent use cases that can be tested for purposes of debugging the linked ICs. The aspects may provide the ability to perform fully functional/large scale and scalable inter-integrated circuit cross triggering with a limited pin interface. The aspects may also allow stopping and resuming hardware cores (based on hardware events/errors or user's intervention) in multiple linked ICs without reconfiguration of a cross trigger interconnect structure. Stop and resume trace capture may also be possible when certain conditions are encountered or met. Cross triggering multiple ICs for controlling statistics and profiling, and connecting an external logic analyzer to monitor certain behaviors, and sending a trigger to the chip to cause a trigger action, e.g. stopping all hardware cores, may also be features of the aspects. Further abilities of the various aspects may include synchronizing timestamps between ICs; capturing a Program Counter (PC) or critical debug information when tracing partial program flow; and generating an interrupt to a specific hardware core when a certain condition(s) is/are met, e.g. removing DRM data when one of the hardware cores enter Debug Mode. The linked ICs may operate asynchronously and a trigger clock may be passed along with other trigger data in each TDP message to implement the debugging techniques uniformly on each IC.

FIG. 1 illustrates an aspect of a TDP communication ring connecting a number of linked ICs. This figure shows how a system of ICs 100 made up of any number of ICs 102*a*-102*n* may be connected in series via a serial TDP communication ring to pass debug triggers from one IC to the next. FIG. 1 illustrates three or more ICs 102*a*-102*n* (IC 1, IC 2, up to IC n) connected in series via a serial TDP communication ring. Each IC 102 may have one or more communication interfaces 104 having at least the ability to receive or transmit signals over the serial TDP communication ring. In FIG. 1 the communication interfaces labeled "IN" correspond to a data input pin that may receive signals from the TDP communication ring, and the communication interfaces labeled "OUT" correspond to a data output pin that may transmit signals. In some aspects the communication interfaces 104 may be configured as one device that may receive and transmit signals from a single communication port with multiple connecting elements, such as pins or other contacts (not shown). Such aspects may not require both "IN" and "OUT" communication interfaces 104 as the "IN" and "OUT" capabilities may be integrated into one "IN/OUT" component (not shown).

Each IC 102*a*-102*n* may be connected to two other ICs via a serial TDP communication ring such that the "IN" communication interface 104 (or data input pin) of one IC (e.g., 102*a*) may be connected to the "OUT" communication interface 104 (or data output pin) of the next IC (e.g., 102*b*). These connections result in a serial configuration of interconnected ICs or interconnected hardware cores. For example, in FIG. 1, the "OUT" communication interface 104 (or data output pin) of IC 1 102*a* is shown connected to the "IN" communication interface 104 (or data input pin) of IC 2 102*b*. Similarly, the "OUT" communication interface 104 (or data output pin) of IC 2 102*b* is shown connected to the "IN" communication interface 104 (or data input pin) of the next IC n 102*n*. There may be any number of similarly connected ICs 102*a*-102*n* between IC 2 and IC n such that IC 2 and IC n are not directly connected. To complete the serial communication ring, the "OUT" communication interface 104 (or data output pin) of IC n 102n may be connected to the "IN" communication interface 104 (or data input pin) of IC 1 102a. This manner of connecting the interconnected ICs forms a ring configuration of interconnected ICs.

The communication interfaces 104 may be connected by a physical conduit 106, which may be an electrically conductive connection (i.e., wire or trace) or an optical conduit (e.g., a fiber optic cable or optical interface).

In another aspect, the communication interfaces 104 may be a wireless communication link (not shown), which may implement a variety of wireless communication protocols (e.g., near field communications (NFC)).

Figure 2:
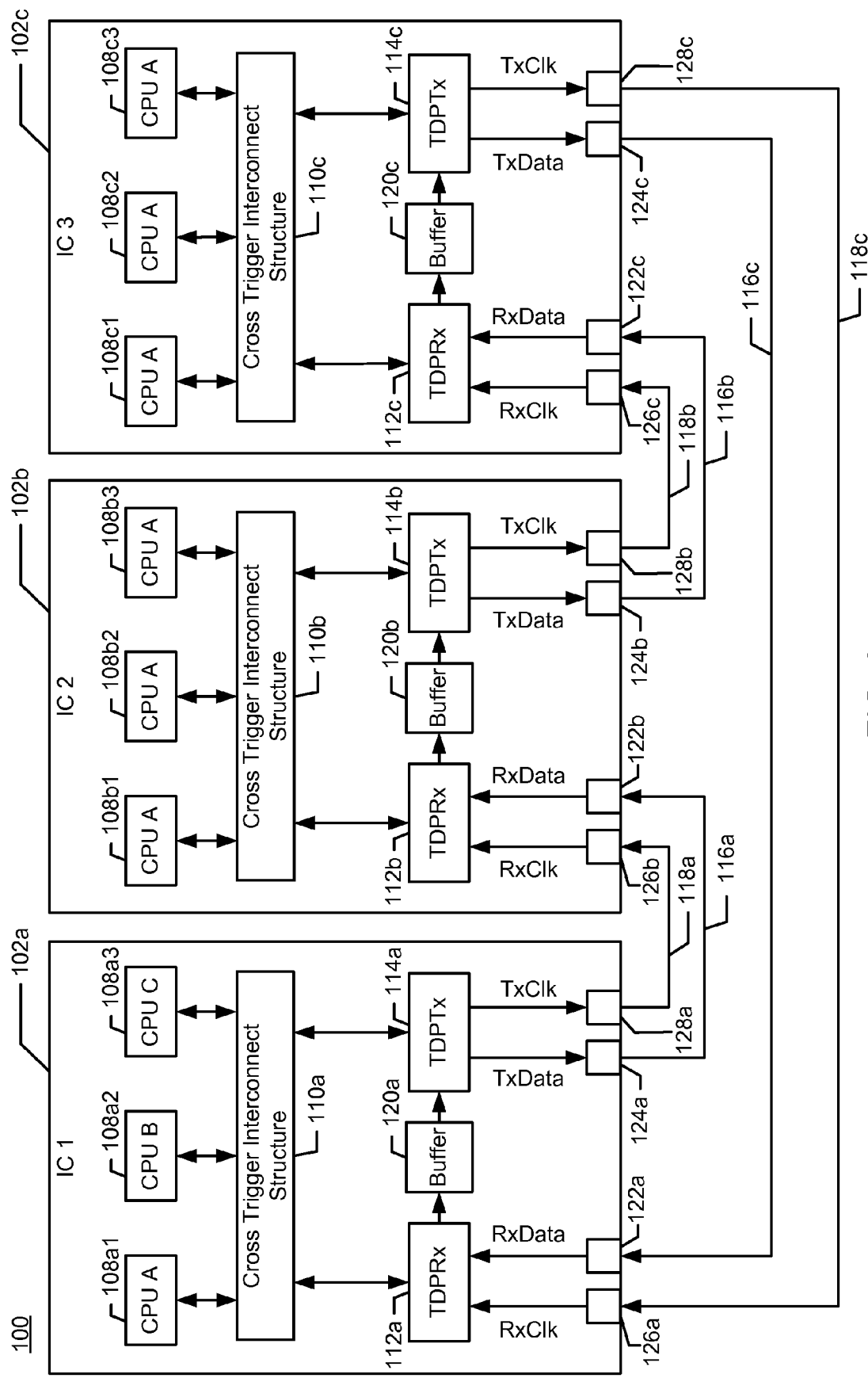
FIG. 2 is a component block diagram illustrating a system having a plurality of integrated circuits communicatively connected in series in accordance with an embodiment.

FIG. 2 illustrates an aspect of the system of ICs 100 as a TDP communication ring connecting three ICs 102a-102c. This figure shows another aspect of the system of ICs 100 having three ICs 102a-102c (IC 1, IC 2, and IC 3), which is exemplary but like FIG. 1 may link any number of ICs in a similar manner. Each IC 102a-102c may include one or more trigger sources and trigger sinks, such as central processing units (CPUs) 108a1-108a3, 108b1-108b3, 108c1-108c3, and a cross trigger interconnect structure 110a-110c. ICs 102a-102c may also include a TDP receiver (TDPRX) 112a-112c and a TDP transmitter 114a-114c (TDPTx) that are linked to corresponding circuits in each IC 102a-102c (i.e., Tx to Rx) with a data line 116a-116c and a clock line 118a-118c in the manner illustrated. Thus in a three-IC configuration: a first IC 102a includes a first TDPTx 114a coupled to a first data output pin 124a and a first TDPRx 112a coupled to a first data input pin 122a; a second IC 102b includes a second TDPTx 114b coupled to a second data output pin 124b and a second TDPRx 112b coupled to a second data input pin 122b; and a third IC 102c includes a third TDPTx 114c coupled to a third data output pin 124c and a third TDPRx 112c coupled to a third data input pin 122c. In such a three-IC configuration, the first data output pin 124a is coupled to the second data input pin 122b by a first data line 116a so that output from the first TDPTx 114a is sent to and received by the second TDPRx 112b, the second data output pin 124b is coupled to the third data input pin 122c by a second data line 116b so that output from the second TDPTx 114b is sent to and received by the third TDPRx 112c, and the third data output pin 124c is coupled to the first data input pin 122a by a third data line 116c so that output from the third TDPTx 114c is sent to and received by the first TDPRx 112a, thereby completing the ring. In a similar manner a first clock output pin 128a is coupled to a second clock input pin 126b by a first clock line 118a, a second clock output pin 128b is coupled to a third clock input pin 126c by a second clock line 118b, and a third clock output pin 128c is coupled to a first clock input pin 126a by a third clock line 118c.

In some embodiments a buffer 120a-120c may be coupled between the TDPRx 112a-112c and TDPTx 114a-114c as illustrated, although the invention may be implemented without a buffer 120a-120c. The TDPRx 112a-112c and TDPTx 114a-114c may be coupled to the cross trigger interconnect structure 110a-110c in each IC 102a-102c, respectively, so that triggers appearing on the cross trigger interconnect structure 110a-110c may be communicated by the TDPTx 114a-114c circuit for transmission to the next IC 102a-102c and triggers received on the TDPRx 112a-112c circuit may be communicated to the cross trigger interconnect structure 110a-110c. As shown in FIG. 2, TDPRx 112a-112c and TDPTx 114a-114c in the ICs 102a-102c may be linked together in a daisy-chain to form a loop spanning all of the ICs 102a-102c.

The cross trigger interconnect structure 110a-110c in each IC 102a-102c may implement debugging trigger management, where the cross trigger interconnect structure 110a-110c may generate debugging triggers based on data from its connected hardware cores 108a1-108a3, 108b1-108b3, 108c1-108c3, to be sent by its connected TDPTx 114a-114c, or generate instructions for its connected hardware cores 108a1-108a3, 108b1-108b3, 108c1-108c3, from triggers received from its connected TDPRx 112a-112c. The debugging triggers may include a variety of functions, such as functions that control the processing states of the hardware cores 108a1-108a3, 108b1-108b3, 108c1-108c3, and ones that instruct the hardware cores 108a1-108a3, 108b1-108b3, 108c1-108c3, to implement processing functions. By passing triggers from the cross trigger interconnect structure 110a in one IC (e.g., 102a) to the cross trigger interconnect structure 110b, 110c, of the other ICs (e.g., 102b, 102c) via the TDPTx/TDPRx communication paths 116a-116c, 118a118c, the triggers appearing/generated on one cross trigger interconnect structure may be applied on the cross trigger interconnect structure of the other ICs, and vice versa. This may enable two, three or more cross trigger interconnect structures to function like a single larger cross trigger interconnect structure spanning two, three or more ICs. In this manner, the cross trigger interconnect structures in any number of ICs may be linked together to function like a single large cross trigger interconnect structure.

In order to minimize the cost and complexity of the communication links, the TDPRx 112a-112c and TDPTx 114a-114c circuits may receive and transmit signals from and to the respectively connected IC 102a-102c using a simple time-division scheme that allocates time slots for communicating triggers. In an example, TDPRx 112b may receive cross trigger interconnect structure trigger data (RxData) and the clock (RxClk) from one IC 102a and the TDPTx 114b may transmit its cross trigger interconnect structure trigger data (TxData) and clock (TxClk) to the next IC 102c. The RxData and RxClk signals received from the IC 102a may be referred to as a first data signal and a first clock signal, and the TxData and TxClk signals sent to the IC 102c may be referred to as a second data signal and a second clock signal. These components may also arrange and interpret data appropriately for use by the cross trigger interconnect structure 110a-110c or for transmitting the data between the ICs 102a-102c. The TDPRx 112a-112c and TDPTx 114a-114c of an IC 102a-102c may also be connected to a buffer 120a-120c, which may be configured to hold received data (RxData) pending for relay/retransmission to the next IC in the ring as transmission data (TxData).

Figure 3:
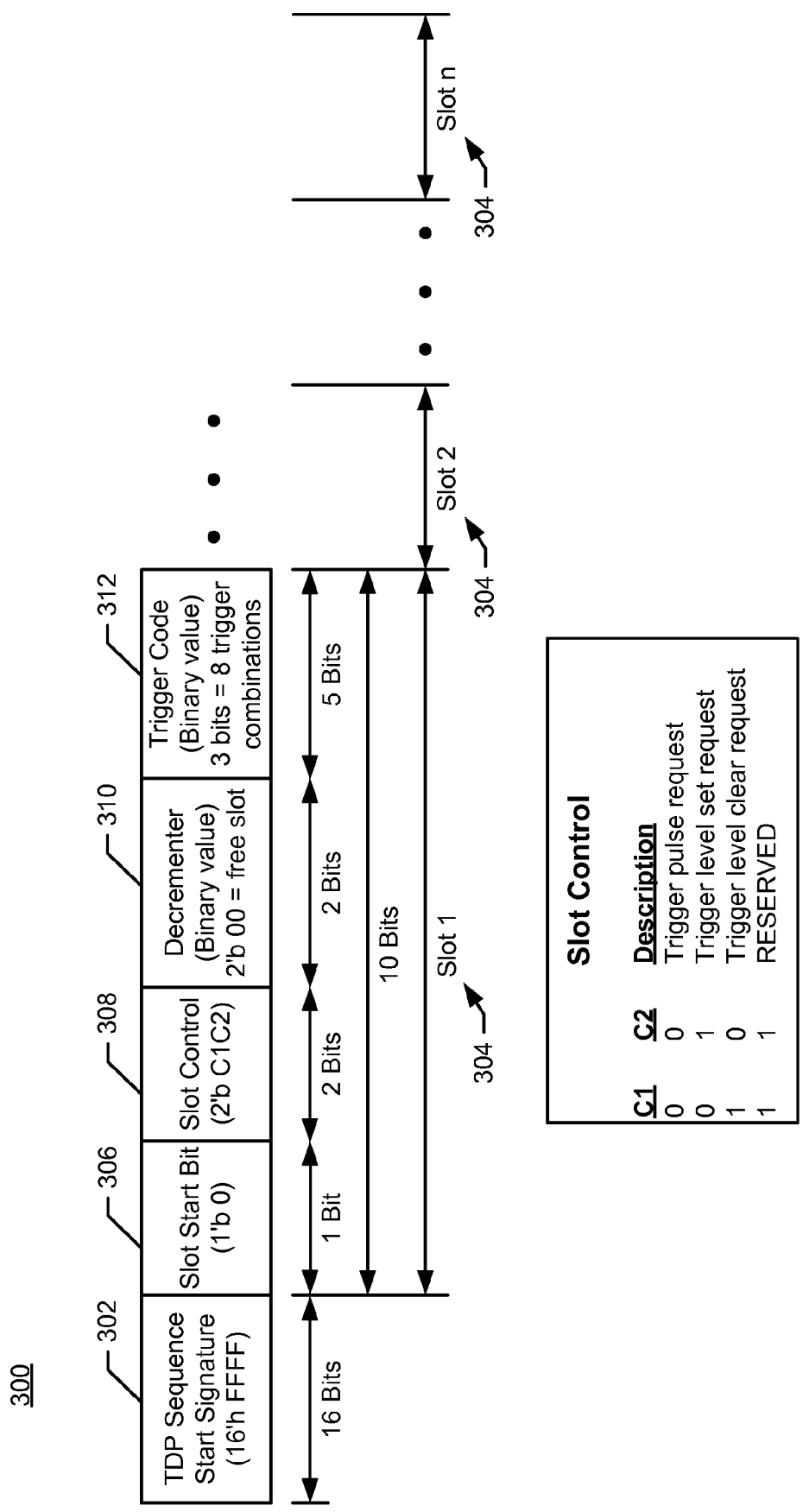
FIG. 3 is a schematic diagram illustrating a communication protocol structure in accordance with an embodiment.

FIG. 3 illustrates an embodiment of the TDP data structure 300 of messages, or TDP signals, that may be sent via the TDP communication ring to pass trigger data between the ICs. Each TDP communication or signal may consist of a sequence start code 302 followed by a number of slots 304 for data. The TDP sequence start signature 302 may be a simple code that the TDPRx circuit can recognize as the start of a communication 300. Each slot may be divided in to portions that may include a slot start code 306, a slot control code 308, a count value or decrementer value 310, and a trigger code 312. The TDP sequence start signature 302 may be of any size and in some instances may not have to be a separate code, but may be integrated into the first slot 304 (Slot 1), such as part of the slot start code 306. Some of the aspects of the TDP sequence start signature 302 may be that it occurs at the beginning of the TDP communication ring communication 300 and that it is not repeated at another time. In this example, the TDP sequence start signature 302 is a 16 bit sequence of four hexadecimal digits "FFFF." However, the size and format of the TDP sequence start signature may vary. It may be that the sequence start signature 302 is non-mimicable throughout the rest of the communication 300 to avoid confusion. In other words, the remainder of the communication 300 may not have the ability to intentionally or unintentionally include data that may replicate the sequence start signature 302. For example, if the sequence start signature 302 is composed of hexadecimal digits, and the remainder of the communication 300 is composed of binary or octal digits, then a hexadecimal sequence including digits 8-F may not be recreated in the rest of the communication 300.

The slot start code 306 may be positioned at the head of the slot 304 to indicate the beginning of the related slot 304. As shown in this example, the slot start code 306 may be a one bit binary value or code. However, in some instances, such as when the TDP sequence start signature 302 is combined with the slot start code 306, the slot start code 306 may be designed as a larger or differently formatted segment of the slot 304, such that it may indicate the beginning of the slot 304 as well as the beginning of the TDP communication ring communication 300.

The slot control code 308 may be configured such that it indicates a trigger control command. In the example in FIG. 3 the slot control code 308 is a two bit binary value or code allowing for up to four different codes or levels. For example, the slot codes may be a trigger pulse request, a trigger level set request, and a trigger level clear request, with the fourth code kept as a reserved code. The trigger pulse request may cause the receiving IC and cross trigger interconnect structure to pulse the trigger for all or a portion of a clock cycle to provide a onetime instruction to one or more of the hardware cores. The trigger level set and clear requests may cause setting a persistent trigger in a high or low state until the trigger source de-asserts the level trigger.

Triggers may be sent one time around the TDP loop, with each IC's TDPTx circuit relaying the trigger until all ICs have received it. This once-around-the-loop process may be controlled by the counter or decrementer value 310 as follows. When a trigger is first transmitted by an IC the count or decrementer value 310 may be set to a number one less than the number of ICs in the loop. Then as each subsequent IC in the loop retransmits the trigger in a slot 304, its TDPTx (or TDPRx) decrements the count or decrementer value 310. When the count or decrementer value 310 reaches zero, for example, the trigger may not be retransmitted by that IC's TDPTx. In other words, after a slot is received by an IC, the count value 310 is modified to indicate that the IC has read the slot 304. In the example of the decrementer value 310, the value is decremented by each IC until the count value 310 equals zero indicating that each IC connected by the TDP communication ring has received the trigger in that slot 304. When the slot count or decrementer value 310 is zero, this indicates that the slot 304 is available to transmit another trigger and thus is a "free slot." Any other count value 310 may indicate that the slot 304 holds a trigger and cannot be written to.

To transmit a trigger received from the IC's cross trigger interconnect structure, the IC's TDPTx circuit may look in a received group of slots for a slot 304 with a count or decrementer value 310 of zero. When such a slot 304 is found, the IC may write a trigger to the trigger code 312 of that slot 304. The trigger may then be scheduled for transmission in that slot 304 along with a count or decrementer 310 value equal to one less than the number of ICs. The packet of data may then be transmitted by the IC's TDPTx to the next IC in the loop, with the packet of data including the TDP sequence start signature 302 followed by slots 304 carrying received and retransmitted trigger values and the new trigger added by the IC. The example in FIG. 3 shows the count value 310 value as a two bit binary value, however the count value 310 may vary in size and format to suit the number of ICs in the system.

The number of free slots any IC may use may be limited so that it does not use all of the available slots 304 and potentially all of the slots 304, which could prevent the other ICs from writing triggers to the slots 304.

The count value 310 may be any value that may be recognized by the ICs as indicating the slot 304 as occupied or free. The count value 310 may be incremented rather than decremented, or modified by a predetermined formula. It may not be necessary that the count value 310 indicate the number of ICs or that the count value 310 be set to zero to indicate that the slot 304 is free. For example, each IC may have a dedicated identification number programmed or assigned dynamically. The identification numbers may be assigned in a logical order or by a formula. When an IC reads an occupied slot 304, it may be able to identify if the IC that wrote the trigger to the slot 304 is the next IC in the TDP communication ring. If so, then the IC may know that it is the last IC to read the trigger in the slot 304 and therefore the slot is now free for use. If the IC has a trigger to write to the slot 304 it may do so and update the count value 310 with its own identification number. Otherwise, the IC may modify the count value 310 to a "free slot" value known to the other ICs.

In some embodiments, a slot 304 may include an assignment value that assigns a slot 304 to a particular IC. Here, only the assigned IC may write to the slot 304. The count value 310 may be used as the assignment value, where the assigned IC knows that the other ICs have read its trigger when the slot returns to the assigned IC. The assignment value may also be a separate portion of the slot 304 while the count value 310 retains the function of indicating whether the other ICs have read the trigger.

Other embodiments may allow any IC to write to any free slot 304 while limiting the maximum number of slots 304 that each IC may occupy. In this manner, as long as there is a free slot 304 received by an IC and the IC is occupying less than its maximum number of slots 304, the IC may write to the free slot 304. If the IC receives a free slot while occupying its maximum number of slots 304, the IC may be prevented from writing to the free slot, and may forward the free slot 304. Each IC may have the same or a different maximum number of occupied slots, and these maximums may be fixed or programmable. Each IC may keep track of the number of slots 304 it occupies and compare that number to its maximum number of slots 304. The count value 310 may be implemented as described herein to determine when a slot is free or occupied.

The trigger code 312 may represent the debugging trigger being communicated between the ICs. Each trigger code 312 may represent one or more different triggers. When an IC reads the trigger code 312, the cross trigger interconnect structure may translate one or more triggers in the trigger code 312 into separate triggers that are passed to the IC's cross trigger interconnect structure. The cross trigger interconnect structure may also receive trigger functions from the trigger sources on or connected to the IC and output the triggers to write to the trigger code 312 portion of the slot 304. The example in FIG. 3 shows the trigger code 312 as a five bit binary value, however the trigger code 312 may vary in size and format to suit the needs of the application. In some embodiments, the trigger code 312 value may be used to represent a request to insert a timestamp on the receiving IC's timestamping infrastructure.

The example in FIG. 3 shows one slot 304 to be 10 bits in length. The size of each slot 304 will generally be uniform, but the size and number of all of the slots 304 may vary. The size of the slots 304 may vary depending on the requirements for each of its parts as described herein. The size may also be a product of the available bandwidth, desired speed of transmission, and time allocated to each slot 304, and the number of slots 304. The number of slots 304 may also vary in this manner. In some embodiments, the number of slots 304 may equal the number of ICs. The number and size of the slots 304 may also be predetermined for a group of linked ICs.

In an example operation, a master IC, for example a trigger issuing IC, may begin the TDP process by broadcasting a non-mimicable TDP sequence start signature 302 followed by a provisionable number of TDP slots 304. An output of the master IC may be a serial TDP data line (TxData) and a clock (TxClk) derived from some internal clock source. The source sync clock between two ICs may not be the same frequency as between some other two ICs in the TDP communication ring. The trigger issuing IC may choose which of its clocks it wants to use to derive its TDP trigger output clock. The receiving IC may use this incoming clock (RxClk). The ICs may operate on clock cycles asynchronous from each other and a trigger clock may be passed along with other trigger data to implement the debugging techniques uniformly on each IC.

The receiving IC may observe this data and clock, and wait for the non-mimicable TDP sequence start signature 302. Each received slot 304 containing trigger data may be decremented and the trigger "pulled off" and passed to that IC's cross trigger interconnect structure. If that slot's count/decrementer value 310 is greater than zero, the trigger data may be transmitted in the same slot 304 to the next IC in the loop. The receiving IC may also wait for an assigned slot 304 or the free TDP slot(s) 304, and source any triggers it has pending to write to the assigned or the free TDP slot(s) 304 since the TDP process was last received. A received slot 304 may not initially be a free slot 304, but may become a free slot 304 when the receiving IC decrements the count/decrementer value 310 to zero after or when reading the slots 304. Thus, a slot 304 becomes free once the trigger value in that slot 304 has been received by every IC other than the master IC in the TDP communication ring. When that happens, the now free slot 304 can be used to transmit a new trigger from the receiving IC's cross trigger interconnect structure once around the ring. However, if there is no trigger value pending in the cross trigger interconnect structure to transmit in the free slot 304, the slot 304 may remain free of data in the transmitted TDP package. In other words, the empty slot 304 remains empty with a count/decrementer value 310 of zero in the transmitted packet, and may remain empty until an IC fills the slot with a trigger value during the process or receiving and retransmitting the TDP package.

Figure 4:
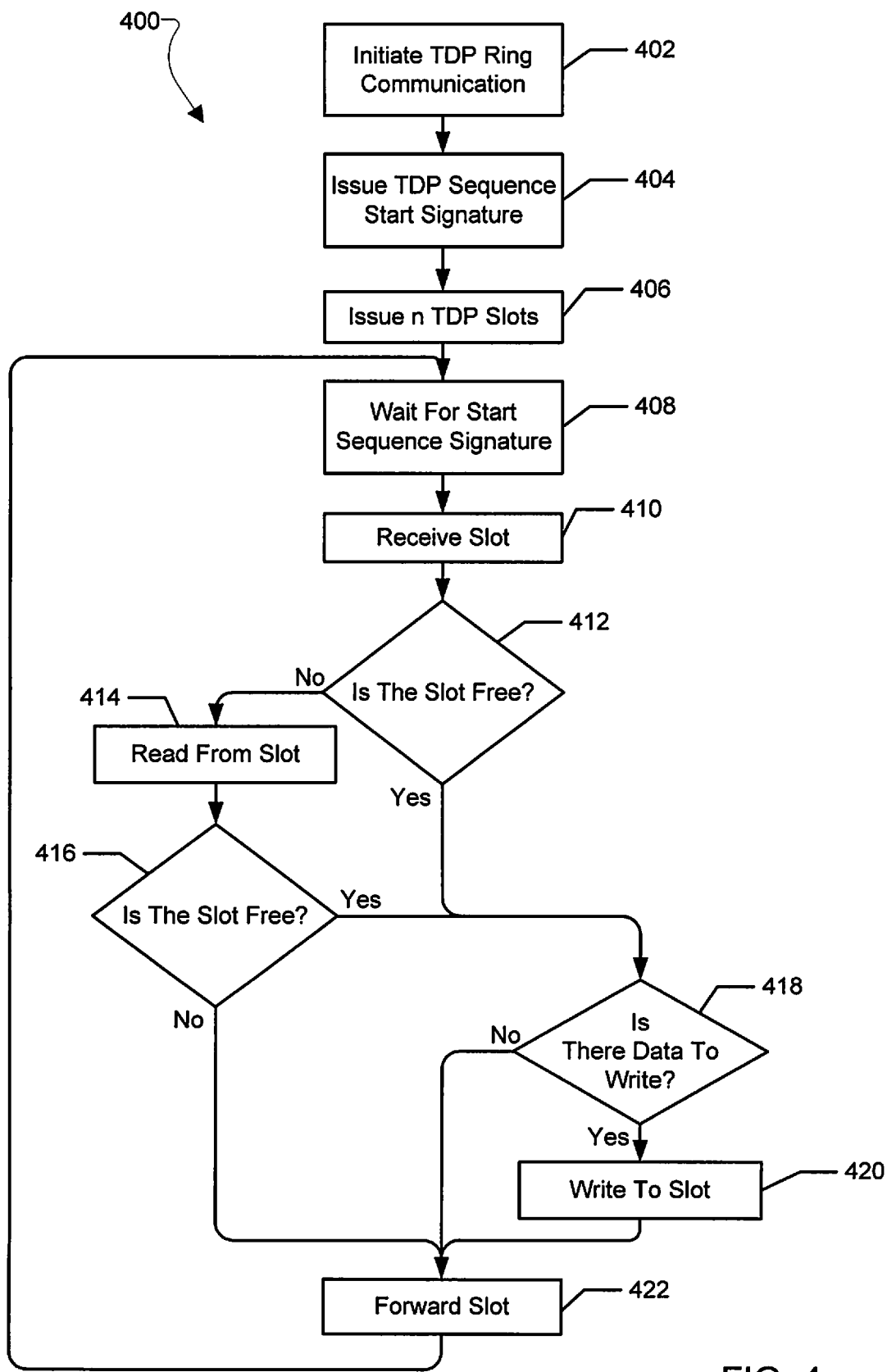
FIG. 4 is a process flow diagram illustrating an embodiment method for time-division packetizing communication between components of a time-division packetizing communication ring.

FIG. 4 illustrates a process flow diagram of an aspect method for time-division packetizing communication between components of a time-division packetizing communication ring 400. In block 402 a master IC may initiate a TDP communication ring communication 300. The master IC may be a predetermined one of the ICs in the TDP communication ring. For example, the master IC may be the only IC in the TDP communication ring that may initiate TDP communication between ICs. Alternatively, the ICs may each be assigned a priority value and may determine which of the ICs of the TDP communication ring may be the master IC. In the latter embodiment, it may be possible for the master IC to change, based on an algorithm, when the original master IC may no longer be able to initiate the TDP communication. Another embodiment may simply allow any of the ICs to be a master IC when the IC has a trigger to transmit and the TDP communication 300 has yet to be initiated. In some instances there may be only one master IC at a time and in others there may be multiple master ICs. The number of master ICs for any TDP communication ring may be limited based one or more factors, including the number of ICs forming the TDP communication ring, the available bandwidth, the size of the communications, desired speed of transmission, and time allocated to each slot.

When the master IC determines to initiate a TDP communication ring communication may vary. In one embodiment, the master IC may only initiate a TDP communication ring communication when it has a trigger pending to transmit to the other ICs. In another embodiment, the master IC may initiate a TDP communication ring communication when it is powered on, when a debugging program is run, or periodically. The master IC may also initiate a TDP communication ring communication in response to a request from another IC when the other IC has a pending trigger transmission. The master IC may also limit initiating a TDP communication ring communication depending on the status of previously initiated TDP communication ring communications. If other TDP communication ring communications are still active, the master IC may determine not to issue a new TDP communication ring communication.

In block 404 the master IC may issue, or transmit, the TDP sequence start signature. Issuing the TDP sequence start signature may involve randomly generating a non-mimicable value within a set of parameters to ensure that the TDP sequence start signature 302 can be recognized but not recreated by the other ICs of the TDP communication ring. Such parameters may include the size, format, and available digits or combination of digits for the TDP sequence start signature. In another embodiment, the TDP sequence start signature 302 may be a predetermined code such that all of ICs of the TDP communication ring may recognize the sequence of bits as the TDP sequence start signature. In block 406 the master IC may issue a number of TDP slots. Issuing the TDP slots may involve determining the number of slots to issue. In one example, the number of slots issued may depend on one or more factors, such as the available bandwidth, the size of the communications, desired speed of transmission, time allocated to each slot, and the number of ICs in the TDP communication ring. In another embodiment the number of slots may be predetermined.

Issuing the TDP slots may also involve structuring the slots. As described in FIG. 3, the slots 304 may include a number of sections of varying size, format, and purpose. For example, a slot 304 may include sections for the slot start code 306, the slot control code 308, the count value or decrementer value 310, and the trigger code 312. Each section may be allocated a certain size depending on the size of the slot 304 and the size requirements for the data in each section. As in other examples, the size of the sections may be predetermined.

The structure of the slot start code 306 may depend on whether the TDP sequence start signature 302 is separate or incorporated into the slot start code 306. The structure of the slot control code 308 may depend on the number of trigger control commands defined for the TDP communication ring. For example, FIG. 3 illustrates the slot control code 308 as a two bit binary value or code. The legend in FIG. 3 describes four possible trigger control commands designated to a respective two bit binary slot control code 308. However, the slot control codes 308 may be fewer or greater in number thereby modifying the required bits and/or format for the slot control code 308. One embodiment might include only two trigger control commands, and in such an instance a one bit binary slot control code 308 may suffice. Alternatively, if more than four trigger control commands are defined, then a three or more bit binary slot control code 308 may be necessary.

The structure of the count/decrementer value 310 may be determined by the number of ICs in the TDP communication ring and/or the method used to keep track of when the ICs have read a trigger transmitted by another IC. Much like the slot control 308, FIG. 3 depicts the count/decrementer value 310 as a two bit binary value or code. This generally only allows for up to five connected ICs, because the highest represented binary value in a two bit binary value or code, "11", is equivalent to four (one less than the total number of ICs). It may be desired to connect more than 5 ICs, or less than four ICs, in which case a two bit binary value or code may not be suitable, or necessary. As described herein, the methods for determining when all of the ICs have read a slot 304 based on the count/decrementer value 310 are varied. The structure of the count/decrementer value 310 may be similarly varied to suit the different methods.

The structure of the trigger code 312 may be determined by the number of triggers defined for the cross trigger interconnect structures. The example in FIG. 3 shows a three bit binary value representing eight trigger combinations. In three bits there is a possibility of eight different combinations of "0" and "1," where each bit may be assigned to a different trigger as interpreted by the cross trigger interconnect structures, and each combination may represent one or more triggers. Fewer triggers may not require all three bits, and a greater number of triggers may require more bits. While the cross trigger interconnect structures may support a number of triggers, it is not necessary for the structure of trigger code 312 to match the number of supported triggers. In one embodiment, a certain debugging routine may only require the use of a subset of triggers supported by the cross trigger interconnect structures. In such an instance, if the triggers used by the routine are assigned to binary bits represented by fewer bits than the full range of supported triggers, then the trigger code 312 may be formatted to include only the fewer bits required.

In other embodiments, a three bit straight binary value or a three bit binary code may represent eight triggers. In three bits there is the possibility of eight different combinations of "0" and "1," and each combination may be assigned to a different trigger as interpreted by the cross trigger interconnect structures. Like other embodiments, fewer triggers may not require all three bits, and a greater number of triggers may require more bits. In another embodiment, each position in the binary value may represent a different trigger number (i.e., a "one hot" scheme). In this manner, more than one trigger may be communicated into a free slot versus only being able to do one trigger at a time per slot as would be the case using binary encoding.

In issuing the slots 304, the master IC may have issued all free slots 304. Alternatively, the master IC may have issued a combination of free slots 304 and occupied slots 304, or only occupied slots 304, to which the master IC has written triggers.

Referring back to FIG. 4, in block 408 the master IC may wait for the TDP communication ring communication to traverse the TDP communication ring via all of the other ICs until the TDP start sequence signature returns to the master IC. Upon receiving the TDP start sequence signature, in block 410 the master IC may receive the slots of the related TDP communication ring communication. In determination block 412 the master IC may determine whether the received slots are free slots or occupied slots. As described, the master IC may make such a determination by reading the count/decremented value to see if the data indicates whether the slot is free or occupied. The value of the data indicating the status of the slot may vary depending on the method used to indicate free and occupied status of the slots. In one embodiment, the slot is free when the count/decremented value is "0," and is occupied for any other count/decremented value.

When the received slot is occupied (i.e. the determination block 412="No"), the master IC may read from the slot in block 414. Reading from the slot is described in greater detail below with reference to FIG. 5. In determination block 416 the master IC may again determine whether the slot is free or occupied. The status of the slot may change upon being read by the master IC when the master IC is the last IC to read the slot. Such a situation may arise where the master IC issued at least one free slot 304 and the next IC in the TDP communication ring wrote a trigger to the slot.

In either instance in which the received slot is determined to be free (i.e. the determination block 412 or 416="Yes"), the master IC may determine whether it has a pending trigger to write to the free slot in determination block 418. This determination may be made by checking multiple components of the master IC. A pending trigger may be pending at one of the hardware cores, at the cross trigger interconnect structure, or at the TDPTx. Each of these components may hold a pending trigger until there is a free slot to which the master IC may write the pending trigger. When the master IC is holding a pending trigger (i.e. the determination block 418="Yes"), the master IC may write the trigger and related data to the free slot in block 420. Writing to the slot is described in greater detail herein with reference to FIG. 6. In block 422 the master IC is done with the received slot and may forward the slot in its modified state to the next IC on the TDP communication ring.

When the master IC determines that the slot is still occupied after reading from the slot (i.e. the determination block 416="No"), or when the master IC determines that it does not have any pending triggers to write to the free slot (i.e. the determination block 418="No"), the master IC may forward the slot in its current state to the next IC on the TDP communication ring in block 422.

The method 400 may be repeated regularly as TDP messages are received so the IC may return to await for the next TDP packet in block 408. The master IC, or another master IC, may initiate another TDP communication ring communication, as described above with reference to block 402, either after a previous TDP communication ring communication has ceased, or while the previous TDP communication ring communication is still active. The operations in blocks 408-422 do not have to be exclusively executed by the master IC. Each IC in the TDP communication ring may execute the operations in blocks 408-422.

Figure 5:
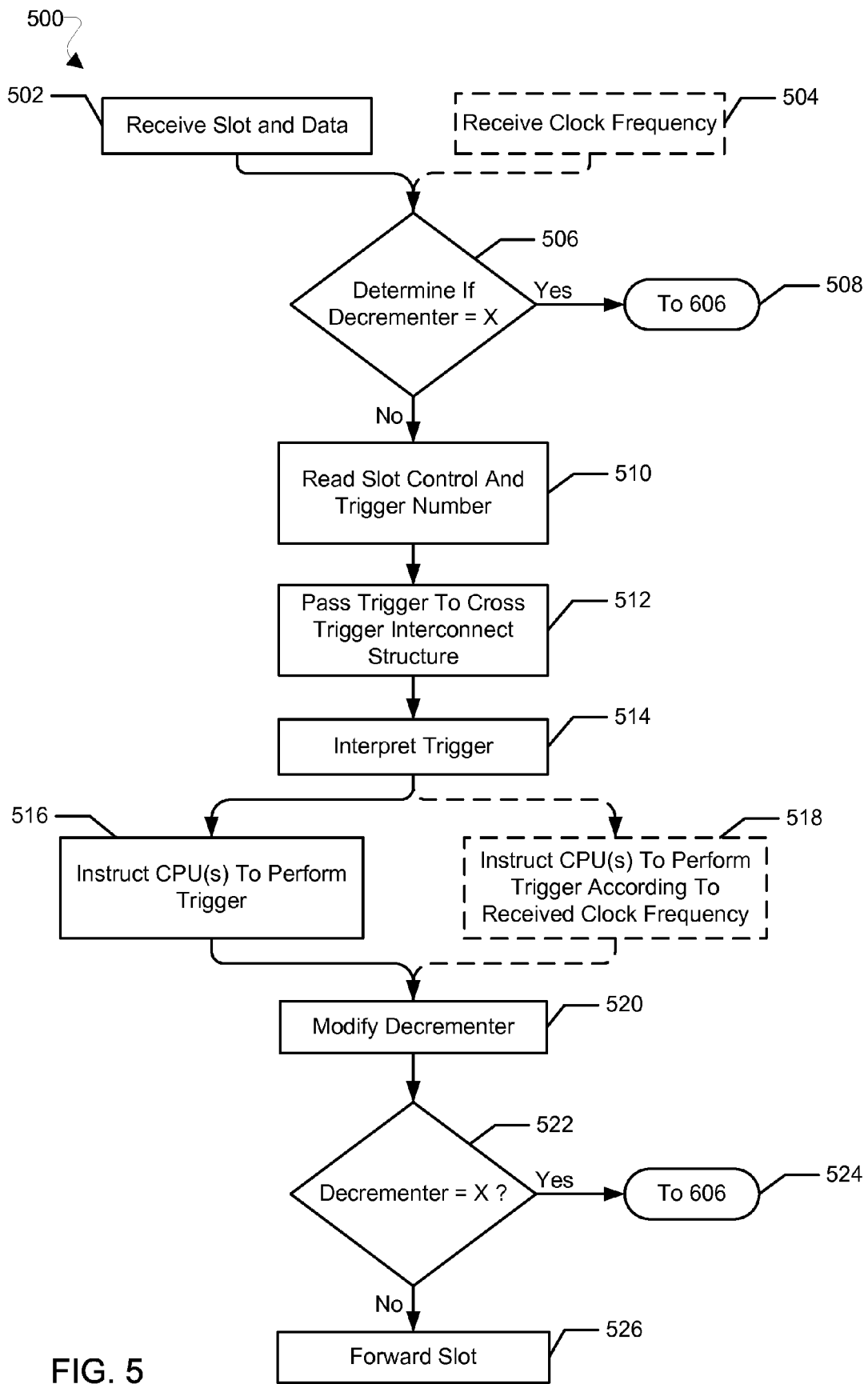
FIG. 5 is a process flow diagram illustrating an embodiment method for reading from communications in a time-division packetizing communication ring.

FIG. 5 illustrates an embodiment method 500 for reading from communications in a time-division packetizing communication ring. In block 502, the IC receives the TDP communication ring communication including the slot and the data (TxData) from the previous IC on the TDP communication ring. Reception of the TDP packet may occur in block 504 concurrently or close in time with reception of the clock signal (TxClk) from the previous IC on the TDP communication ring. In determination block 506 the IC may determine whether the count/decrementer value is equal to a value "X."

Similar to determination blocks 412 and 416 described above, the decision made in determination block 506 functions to determine whether the slot being read is free or occupied. In this embodiment the determination is made by the IC based on whether the count/decrementer value is equal to a value "X." As described herein, the value of "X" may vary depending on the method used to indicate whether a slot 304 is free or occupied. Other embodiments may not require the count/decrementer value to equal a value "X," but rather be greater than (or equal to), less than (or equal to), not equal to, or have some other formulaic relationship to the value "X."

When the IC determines that the slot is free (i.e. the determination block 506="Yes"), the IC may continue with the operations in block 606 as described below with reference to FIG. 6 in block 508. When the slot is occupied (i.e. the determination block 506="No"), the IC may read other portions of the slot. In block 510 the IC may read the slot control code and the trigger code. Reading the slot control code and the trigger code may occur concurrently or serially and in any order. The slot control code and the trigger code may be read from the slot by the TDP receiver (TDPRx) and passed to the cross trigger interconnect structure in block 512. In block 514 the cross trigger interconnect structure may interpret the trigger such that it may communicate the trigger as an instruction, or trigger function, for one or more trigger sinks, like the hardware cores of the IC. The cross trigger interconnect structure may contain a table, or other data structure, for relating the trigger to a hardware core instruction. In the embodiment of a table, the cross trigger interconnect structure may find a row in the table containing the trigger in one column and the related hardware core instruction(s) in another. Alternatively, the trigger may be related to or may be used as a variable for a function to determine a pointer for where to access the related hardware core instruction(s) within a data structure.

In block 516 the cross trigger interconnect structure may instruct the hardware cores to execute the trigger related hardware core instruction(s). In an alternative embodiment, in block 518 the cross trigger interconnect structure may instruct the hardware cores to execute the trigger related hardware core instruction(s) in synch with a clock frequency received from the TxClk signal as the RxClk signal. In block 520 the IC may decrement the count/decrementer value, or otherwise modify it according to the method being used to indicate a free or occupied slot. In block 522, like in block 506, the IC may if the count/decrementer value is equal to a value "X," or otherwise determine whether the slot being read is free or still occupied. When the slot is free (i.e. the determination block 522="Yes"), in block 524 the IC may execute the operations in block 606 described below with reference to FIG. 6. When the slot is still occupied (i.e. the determination block 522="No"), the IC may forward the slot, along with the IC's TxData and possibly its TxClk, to the next IC on the TDP communication ring in block 526.

Figure 6:
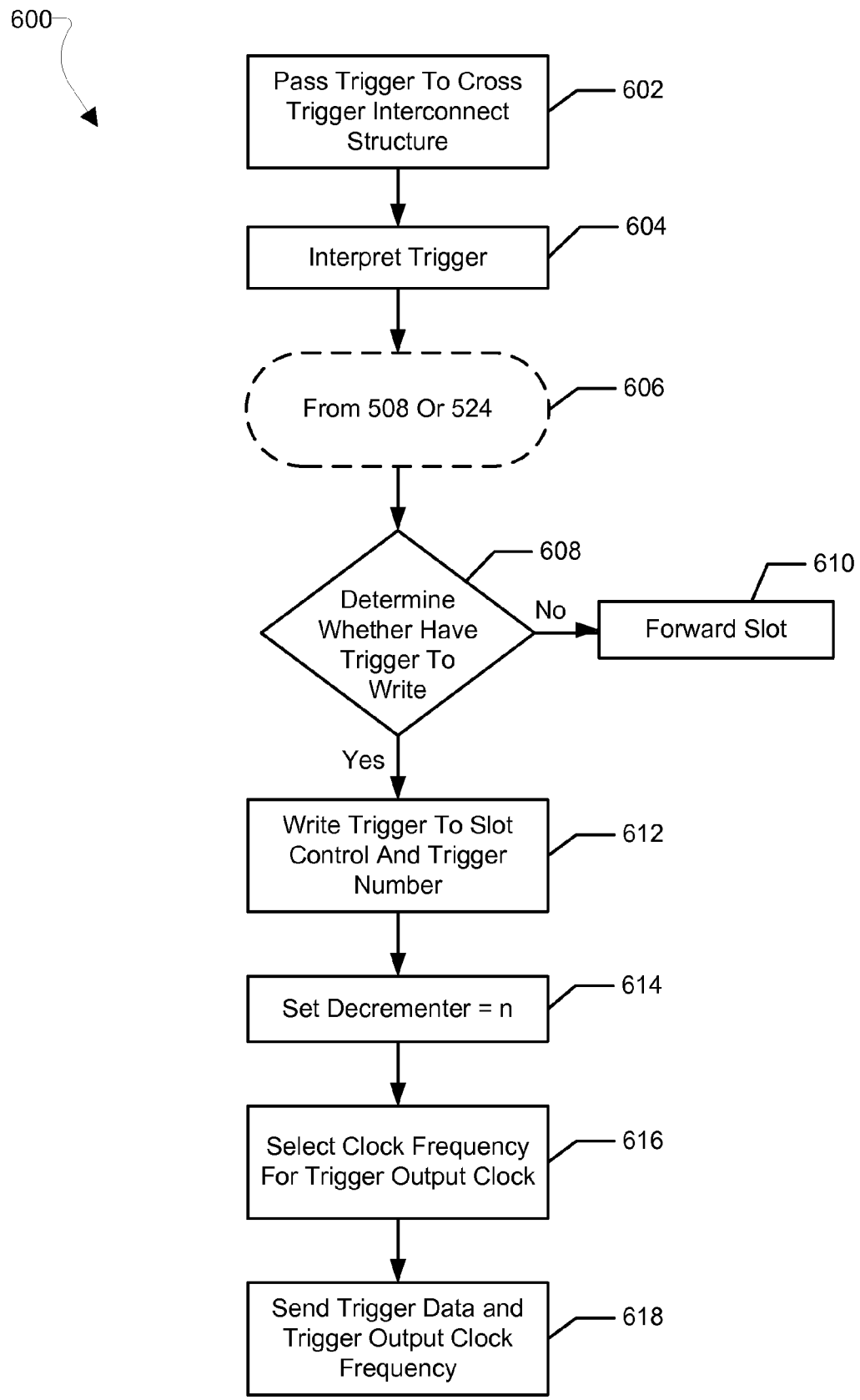
FIG. 6 is a process flow diagram illustrating an embodiment method for writing to communication in a time-division packetizing communication ring.

FIG. 6 illustrates a process flow diagram of an embodiment method for writing to communications in a time-division packetizing communication ring 600. In some embodiments, in block 602 one or more trigger sources of the IC may pass a trigger instruction to the cross trigger interconnect structure. In the reverse process of block 514, in block 604 the cross trigger interconnect structure may interpret the instruction, or trigger function, from the trigger sources, like the hardware core(s), such that it may communicate the instruction as a trigger for one or more of the ICs on the TDP communication ring.

In some embodiments, the trigger function resulting from the interpretation of a received trigger value by the cross trigger interconnect structure, as in block 514, may be referred to as a first trigger function. The trigger function resulting in the trigger value from the interpretation by the cross trigger interconnect structure in block 604 may be referred to as a second trigger function.

Embodiments may optionally include block 606 stemming from the reading method 500. During the method 500 the IC determined that the slot 304 being read was free (i.e. the determination block 506 or 522="Yes"), and continued to perform the operations in blocks 508 or 524, respectively, which include the operations in block 606.

In determination block 608 the IC determines whether it has any pending triggers to write to a free slot and transmit to the other ICs on the TDP communication ring. When the IC does not have a pending trigger (i.e. the determination block 608="No"), the free slot may be forwarded to the next IC on the TDP communication ring in block 610. When the IC does have a pending trigger (i.e. the determination block 608="Yes"), the IC may write the trigger to the trigger code and a related trigger control to the slot control code of the free slot in block 612. In some embodiments, writing the trigger and trigger control to the trigger code and the slot control code may be accomplished by the TDPTx.

In an embodiment method 500 in which a trigger value is read from the occupied slot, such a trigger value may be referred to as a first trigger value. When the IC has read the first trigger value and determined that the slot is now a free slot, the ICs pending trigger may be a second trigger value. The second trigger value may be written to the free slot as a second trigger value.

In varying embodiments, the pending trigger may be stored on one or more of the hardware cores, the cross trigger interconnect structure, or the TDP transmitter (TDPTx) of the IC. When the trigger is stored on one of more of the hardware cores, the IC may perform the operations in blocks 602 and 604 between the operations in blocks 608 and 612.

In block 614 the count/decrementer value may be set such that the value written to this portion of the slot indicates that the slot is occupied. As described herein, various methods may be used to determine whether a slot is free or occupied. The data written to the count/decrementer value may depend on the method employed for determining the status of the slot. One such described method is to decrement count/decrementer value each time an IC reads the slot until the data of count/decrementer value is equal to a specific value indicating a free slot, where all other values indicate the slot is occupied. One approach to this method may be to set the count/decrementer value to one less than the total number of ICs on the TDP communication ring. This approach may allow the count/decrementer value to be decremented by one each time an IC reads the slot. When the last IC, i.e. the IC positioned to transmit to the IC which wrote the trigger to the slot, reads the slot, the count/decrementer value may reach a value of zero. When the count/decrementer value reaches zero, the ICs may recognize that all of the other ICs have read the slot and that the slot is then free.

In block 616 the IC writing to the slot may select a clock frequency, or trigger output clock, to be sent alongside the slot so that the receiving IC implements the trigger according to the selected clock frequency. The individual ICs on the TDP communication ring may execute asynchronously. The tasks of each IC may or may not be tied to the other ICs, and as such the ICs do not need to run synchronously. Each IC may run on clocks of the same or different frequency, and in or out of phase with the clocks of the other ICs. To execute the trigger in a uniform manner on each IC to affect the intended results the transmitting IC may select the clock frequency and phase by which the receiving ICs may implement the trigger.

In block 618 the IC writing the trigger to the slot may send the TDP communication with the slot containing the modified trigger code 312, slot control code, and count/decrementer value to the next IC on the TDP communication ring. The transmitting IC may also send the trigger output clock before, after, or concurrently with the slot. The trigger output clock may be transmitted as TxClk and received by the next IC as RxClk.

Figure 7:
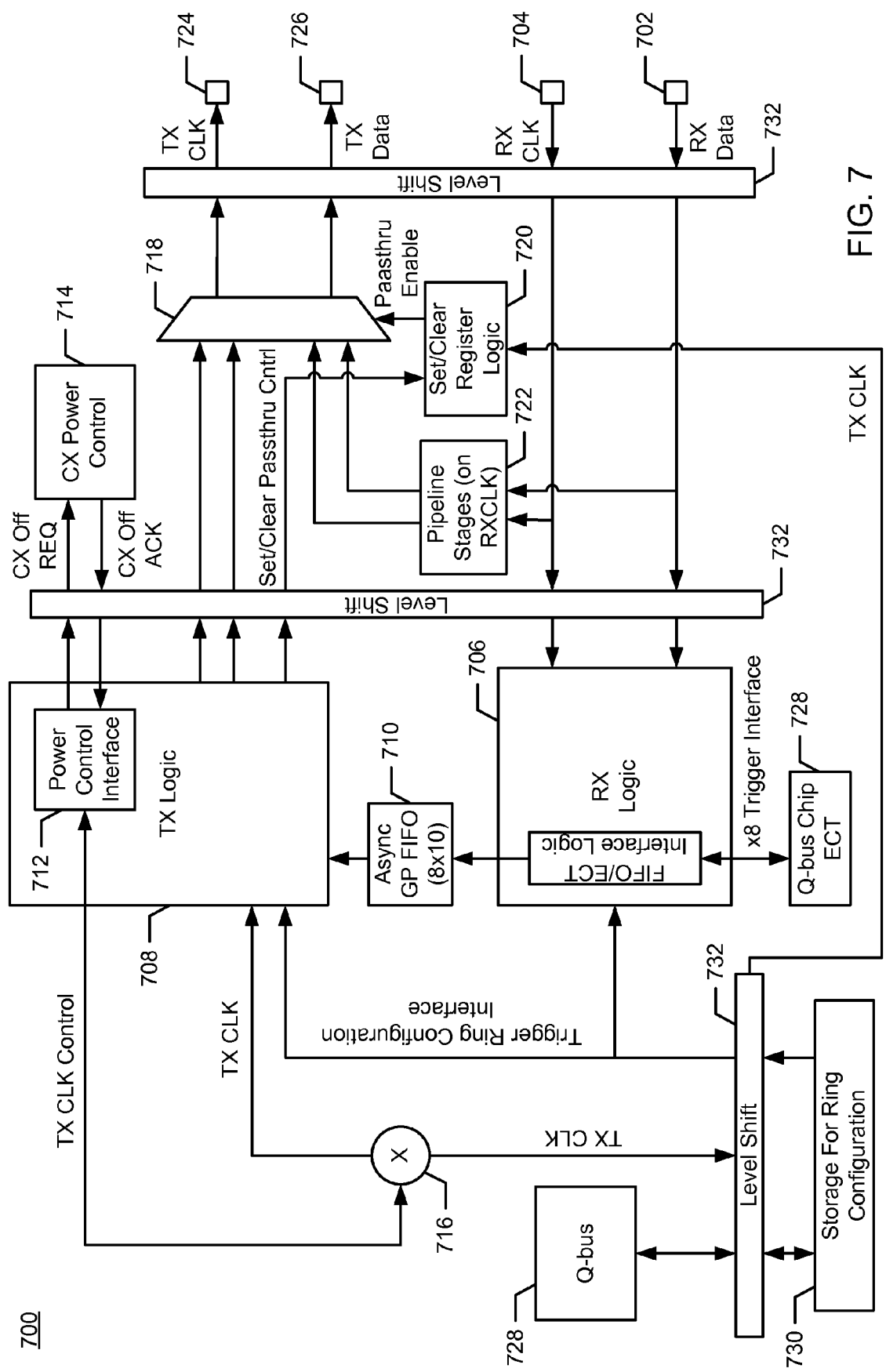
FIG. 7 is a component diagram of an exemplary implementation of a communication circuit of an integrated circuit for use with a time-division packetizing communication ring in accordance with an embodiment.

FIG. 7 illustrates a component diagram of an example implementation of a communication circuit of an IC for use with a time-division packetizing communication ring (TD-PRx/Tx) 700 in accordance with an embodiment. The TDPRx/Tx circuit 700 may include a data input pin or port 702 and a data output pin or port 704 for RxData and RxClk, respectively. These input and output pins/ports 702, 704 may be connected to an Rx Logic chip or module 706 which may contain instructions for managing the RxData and RxClk. The Rx Logic module 706 may be connected to a Tx Logic chip or module 708 which may contain instructions for managing TxData and TxClk. The Rx Logic module 706 may be connected to the Tx Logic module 708 via a buffer 710, which may delay or hold data for transfer from the Rx Logic module 706 to the Tx Logic module 708.

The Tx Logic module 706 may include a power control interface 712 to communicate signals to the IC's main power rail (Cx) power control chip or module 714. Such signals may include a Cx on/off request to which the Cx power control module 714 may respond with a Cx on/off acknowledgement. The Cx power control module 714 may regulate the power provided to portions of the TDP communication ring logic.

The Tx Logic module 706 and power control interface 712 may be connected to a switch or clock 716 which may be used to control when certain instructions are implemented. The clock 716 may also be used to provide the TxClk signal when the IC transmits a trigger on a slot 304. The Tx Logic module 706 may also send signals, such as TxData and TxClk signals, to a multiplexer 718 for implementing the time-division packetizing communications. The Tx Logic module 706 may also be connected to a set/clear register logic chip or module 720, to which the Tx Logic module 706 may send set/clear pass-through control signals. The set/clear register logic module 720 may also be controlled by the clock 716. The multiplexer 718 may receive a pass-through enable input from the set/clear register logic module 720, which may allow the TDPRx/Tx circuit 700 to transmit the TxData and TxClk. Pipeline stages (on RxClk) 722 may facilitate the communication of signals between the components for interfacing with other ICs, such as pins or ports 702, 704, 724, and 726, and the other components of the IC, such as the Rx Logic module 706 and the Tx Logic module 708, resulting from limitations caused by distances in a physical implementation of an IC. The multiplexer 718 may control when and how the TxData and TxClk are provided to output ports 724 and 726.

Other components may include Q-bus chips or modules 728 for managing communications between the components of the Rx/TxTMD circuit 700. A storage for ring configuration component 730 may provide the Rx/TxTMD circuit 700 with parameters for the structure of the TDP communication ring including the ICs on the TDP communication ring and other parameters described herein for composing the TDP communications. One or more level shifters 732 may be included to facilitate passing instructions between components of varying voltage domains so that the components may understand and manage those instructions.

The foregoing method descriptions and the process flow diagrams are provided merely as illustrative examples and are not intended to require or imply that the operations of the various embodiments must be performed in the order presented. As will be appreciated by one of skill in the art the order of operations in the foregoing embodiments may be performed in any order. Words such as "thereafter," "then," "next," etc. are not intended to limit the order of the operations; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm operations described in connection with the various embodiments may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable medium or s non-transitory processor-readable medium. The operations of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A method for communicating trigger values for use in debugging a plurality of interconnected hardware cores, comprising:
    initiating, by a first interconnected hardware core, a time-division packetizing (TDP) signal having a sequence start signature and a number of slots, wherein each slot includes a count value configured to indicate whether the slot is free or contains a trigger value;
    sending, by the first interconnected hardware core, the TDP signal to a second interconnected hardware core;
    receiving, by the first interconnected hardware core, the TDP signal from a third interconnected hardware core;
    determining, by the first interconnected hardware core, whether each slot contains a first trigger value based on a first count value of the slot;
    for each slot containing the first trigger value, passing the first trigger value to a cross trigger interconnect structure of the first interconnected hardware core and modifying the slot's first count value;
    retransmitting the TDP signal including the sequence start signature and the number of slots in which each slot includes one of:
        the first trigger value when the slot's modified first count value indicates the slot contains the first trigger value;
        a second trigger value obtained from the cross trigger interconnect structure along with a second count value indicating the slot contains the second trigger value when the first interconnected hardware core has the second trigger value to transmit and the slot's modified first count value indicates the slot is free; and
        the second count value indicating the slot is free when the first interconnected hardware core does not have the second trigger value to transmit and the slot's modified first count value indicates that the slot is free.

2. The method of claim 1, further comprising:
    sending, by the first interconnected hardware core, a first clock signal to the second interconnected hardware core; and
    receiving, by the first interconnected hardware core, a second clock signal from the third interconnected hardware core.

3. The method of claim 2, wherein the received second clock signal is the first clock signal.

4. The method of claim 2, wherein the received second clock signal is different from the first clock signal.

5. The method of claim 2, further comprising:
    associating, by the cross trigger interconnect structure of the first interconnected hardware core, a first trigger function to the first trigger value; and
    implementing, by the first interconnected hardware core, the first trigger function according to the first clock signal.

6. The method of claim 1, further comprising:
    associating, by the cross trigger interconnect structure of the first interconnected hardware core, the second trigger value to a second trigger function; and
    writing, by the first interconnected hardware core, the second trigger value and the second count value to the slot.

7. The method of claim 1, further comprising:
    setting the first and second count values to one less than the plurality of interconnected hardware cores, wherein the first count value is configured to represent a number of interconnected hardware cores yet to read the first trigger value, the second count value is configured to represent a number of interconnected hardware cores yet to read the second trigger value, and the first and second count values are configured to indicate the slot is free when the first and second count values are equal to zero, and
    wherein modifying the first count value further comprises decrementing the first count value.

8. The method of claim 1, wherein the plurality of interconnected hardware cores are configured to connect in a ring configuration such that each interconnected hardware core is configured to connect to two other interconnected hardware cores, wherein the first interconnected hardware core is configured to transmit to the second interconnected hardware core and receive from the third interconnected hardware core, the second interconnected hardware core is configured to transmit to the third interconnected hardware core and receive from the first interconnected hardware core, and the third interconnected hardware core is configured to transmit to the first interconnected hardware core and receive from the second interconnected hardware core.

9. The method of claim 1, wherein the plurality of interconnected hardware cores are configured to operate via asynchronous clock cycles.

10. A first integrated circuit, comprising:
    a plurality of trigger sources and trigger sinks;
    a cross trigger interconnect structure configured to interconnect the plurality of trigger sources and trigger sinks;
    a time-division packetizing transmitter (TDPTx) circuit coupled to the cross trigger interconnect structure and to a data output pin and configured to connect to a second integrated circuit; and
    a time-division packetizing receiver (TDPRx) circuit coupled to the cross trigger interconnect structure and to a data input pin and configured to connect to a third integrated circuit,
    wherein the TDPRx circuit is configured to perform operations comprising:
        receiving a time-division packetizing (TDP) signal from the third integrated circuit, the TDP signal having a sequence start signature and a number of slots, wherein each slot includes a count value configured to indicate whether the slot is free or contains a trigger value;
        determining whether each slot in the TDP signal contains a first trigger value based on a first count value of the slot; and
        passing the first trigger value in each slot containing the first trigger value to the cross trigger interconnect structure and modifying the slot's first count value;
    wherein the TDPTx circuit is configured to perform operations comprising:
        retransmitting to the second integrated circuit the TDP signal including the sequence start signature and the number of slots in which each slot includes one of:

the first trigger value when the slot's modified first count value indicates the slot contains the first trigger value;

a second trigger value obtained from the cross trigger interconnect structure along with a second count value indicating the slot contains the second trigger value when the first integrated circuit has the second trigger value to transmit and the slot's modified first count value indicates the slot is free; and the second count value indicating the slot is free when the first integrated circuit does not have the second trigger value to transmit and the slot's modified first count value indicates that the slot is free.

11. The first integrated circuit of claim 10, wherein the TDPTx circuit is coupled to a clock output pin, and is configured to perform operations further comprising sending a first clock signal to the second integrated circuit; and wherein the TDPRX circuit is couple to a clock input pin and is configured to perform operations further comprising receiving a second clock signal from the third integrated circuit.

12. The first integrated circuit of claim 11, wherein the received second clock signal is the first clock signal.

13. The first integrated circuit of claim 11, wherein the received second clock signal is different from the first clock signal.

14. The first integrated circuit of claim 11, wherein the cross trigger interconnect structure is configured to perform operations comprising:

associating a first trigger function to the first trigger value; and wherein at least one of the plurality of trigger sources and trigger sinks is configured to perform operations comprising implementing the first trigger function according to the first clock signal.

15. The first integrated circuit of claim 10, wherein the cross trigger interconnect structure is configured to perform operations comprising:

associating the second trigger value to a second trigger function; and wherein the TDPRx circuit is configured to perform operations further comprising writing the second trigger value and the second count value to the slot.

16. The first integrated circuit of claim 10, wherein the TDPRx circuit is configured to perform operations further comprising setting the first and second count values to one less than a number of the integrated circuits, wherein the first count value is configured to represent a number of the integrated circuits yet to read the first trigger value, the second count value is configured to represent a number of the integrated circuits yet to read the second trigger value, and the first and second count values are further configured to indicate the slot is free when the first and second count values are equal to zero, and wherein the TDPRx circuit is configured to perform operations further comprising modifying the first count value such that modifying the first count value further comprises decrementing the first count value.

17. The first integrated circuit of claim 10, wherein the TDPTx circuit of the first integrated circuit is configured to connect to a second TDPRx circuit of the second integrated circuit, a second TDPTx circuit of the second integrated circuit is configured to connect to a third TDPRx circuit of the third integrated circuit, and the TDPRx circuit of the first integrated circuit is configured to connect to a third TDPTx circuit of the third integrated circuit such that the integrated circuits are connected in a ring configuration.

18. The first integrated circuit of claim 10, wherein the first integrated circuit is configured to operate via a clock cycle asynchronous to a clock cycle of the second integrated circuit and the third integrated circuit.

19. A non-transitory processor-readable medium having stored thereon processor-executable software instructions configured to be executed by an interconnected hardware core to perform operations comprising:

initiating, by a first interconnected hardware core, a time-division packetizing (TDP) signal having a sequence start signature and a number of slots, wherein each slot includes a count value configured to indicate whether the slot is free or contains a trigger value;

sending, by the first interconnected hardware core, the TDP signal to a second interconnected hardware core;

receiving, by the first interconnected hardware core, the TDP signal by a third interconnected hardware core;

determining, by the first interconnected hardware core, whether each slot contains a first trigger value based on a first count value of the slot;

for each slot containing the first trigger value, passing the first trigger value to a cross trigger interconnect structure of the first interconnected hardware core and modifying the slot's first count value;

retransmitting the TDP signal including the sequence start signature and the number of slots in which each slot includes one of:

the first trigger value when the slot's modified first count value indicates the slot contains the first trigger value;

a second trigger value obtained from the cross trigger interconnect structure along with a second count value indicating the slot contains the second trigger value when the first interconnected hardware core has the second trigger value to transmit and the slot's modified first count value indicates the slot is free; and the second count value indicating the slot is free when the first interconnected hardware core does not have the second trigger value to transmit and the slot's modified first count value indicates that the slot is free.

20. The non-transitory processor-readable medium of claim 19, wherein the stored processor-executable software instructions are configured to be executed by the interconnected hardware core to perform operations further comprising:

sending, by the first interconnected hardware core, a first clock signal to the second interconnected hardware core; and receiving, by the first interconnected hardware core, a second clock signal from the third interconnected hardware core.

21. The non-transitory processor-readable medium of claim 20, wherein the received second clock signal is the first clock signal.

22. The non-transitory processor-readable medium of claim 20, wherein the received second clock signal is different from the first clock signal.

23. The non-transitory processor-readable medium of claim 20, wherein the stored processor-executable software instructions are configured to be executed by the interconnected hardware core to perform operations further comprising:

associating, by the cross trigger interconnect structure of the first interconnected hardware core, a first trigger function to the first trigger value; and implementing, by the first interconnected hardware core, the first trigger function according to the first clock signal.

24. The non-transitory processor-readable medium of claim 19, wherein the stored processor-executable software instructions are configured to be executed by the interconnected hardware core to perform operations further comprising:
associating, by the cross trigger interconnect structure of the first interconnected hardware core, the second trigger value to a second trigger function; and
writing, by the first interconnected hardware core, the second trigger value and the second count value to the slot.

25. The non-transitory processor-readable medium of claim 19, wherein the stored processor-executable software instructions are configured to be executed by the interconnected hardware core to perform operations further comprising:
setting the first and second count values to one less than a number of interconnected hardware cores, wherein the first count value is configured to represent a number of interconnected hardware cores yet to read the first trigger value, the second count value is configured to represent a number of interconnected hardware cores yet to read the second trigger value, and the first and second count values are configured to indicate the slot is free when the first and second count values are equal to zero, and
wherein modifying the first count value further comprises decrementing the first count value.

26. The non-transitory processor-readable medium of claim 19, wherein interconnected hardware cores are configured to connect in a ring configuration such that each interconnected hardware core is configured to connect to two other interconnected hardware cores, wherein the first interconnected hardware core is configured to transmit to the second interconnected hardware core and receive from the third interconnected hardware core, the second interconnected hardware core is configured to transmit to the third interconnected hardware core and receive from the first interconnected hardware core, and the third interconnected hardware core is configured to transmit to the first interconnected hardware core and receive from the second interconnected hardware core.

27. The non-transitory processor-readable medium of claim 19, wherein interconnected hardware cores are configured to operate via asynchronous clock cycles.

28. A circuit for use in debugging a plurality of interconnected hardware cores, comprising:
means for initiating within a first interconnected hardware core a time-division packetizing (TDP) signal having a sequence start signature and a number of slots, wherein each slot includes a count value configured to indicate whether the slot is free or contains a trigger value;
means for sending the TDP signal to a second interconnected hardware core;
means for receiving the TDP signal by a third interconnected hardware core;
means for determining whether each slot contains a first trigger value based on a first count value of the slot;
means for passing the first trigger value to a cross trigger interconnect structure of the first interconnected hardware core and means for modifying the slot's first count value for each slot containing the first trigger value;
means for retransmitting the TDP signal including the sequence start signature and the number of slots in which each slot includes one of:

the first trigger value when the slot's modified first count value indicates the slot contains the first trigger value;
a second trigger value obtained from the cross trigger interconnect structure along with a second count value indicating the slot contains the second trigger value when the first interconnected hardware core has the second trigger value to transmit and the slot's modified first count value indicates the slot is free; and
the second count value indicating the slot is free when the first interconnected hardware core does not have the second trigger value to transmit and the slot's modified first count value indicates that the slot is free.

29. The circuit claim 28, further comprising:
means for sending a first clock signal from the first interconnected hardware core to the second interconnected hardware core; and
means for receiving a second clock signal from the third interconnected hardware core.

30. The circuit of claim 29, wherein the received second clock signal is the first clock signal.

31. The circuit of claim 29, wherein the received second clock signal is different from the first clock signal.

32. The circuit of claim 29, further comprising:
means for associating a first trigger function to the first trigger value; and
means for implementing the first trigger function according to the first clock signal.

33. The circuit of claim 28, further comprising:
means for associating the second trigger value to a second trigger function; and
means for writing the second trigger value and the second count value to the slot.

34. The circuit of claim 28, further comprising:
means for setting the first and second count values to one less than the plurality of interconnected hardware cores, wherein the first count value is configured to represent a number of interconnected hardware cores yet to read the first trigger value, the second count value is configured to represent a number of the interconnected hardware cores yet to read the second trigger value, and the first and second count values are configured to indicate the slot is free when the first and second count values are equal to zero, and
wherein the means for modifying the first count value further comprises means for decrementing the first count value.

35. The circuit of claim 28, wherein the plurality of interconnected hardware cores are configured to connect in a ring configuration such that each interconnected hardware core is configured to connect to two other interconnected hardware cores, wherein the first interconnected hardware core is configured to transmit to the second interconnected hardware core and receive from the third interconnected hardware core, the second interconnected hardware core is configured to transmit to the third interconnected hardware core and receive from the first interconnected hardware core, and the third interconnected hardware core is configured to transmit to the first interconnected hardware core and receive from the second interconnected hardware core.

36. The circuit of claim 28, wherein the plurality of interconnected hardware cores are configured to operate via asynchronous clock cycles.

* * * * *